United States Patent
Schumacher et al.

(10) Patent No.: US 6,362,539 B1
(45) Date of Patent: Mar. 26, 2002

(54) METHOD AND CIRCUIT FOR MONITORING A PRIMER CIRCUIT IN THE SAFETY SYSTEM OF A VEHICLE

(75) Inventors: Hartmut Schumacher, Freiberg; Klaus Ringger, Nuertingen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/508,649

(22) PCT Filed: Jun. 17, 1999

(86) PCT No.: PCT/DE99/01779

§ 371 Date: May 25, 2000

§ 102(e) Date: May 25, 2000

(87) PCT Pub. No.: WO00/03896

PCT Pub. Date: Jan. 27, 2000

(30) Foreign Application Priority Data

Jul. 16, 1998 (DE) .......................................... 198 32 019

(51) Int. Cl.⁷ .............................................. B60R 21/32
(52) U.S. Cl. ...................................... 307/10.1; 324/502
(58) Field of Search ................................ 307/9.1, 10.1; 280/735; 324/502, 525

(56) References Cited

U.S. PATENT DOCUMENTS 4,973,912 A * 11/1990 Kaminski et al. ........... 324/652
6,133,741 A * 10/2000 Mattes et al. ................ 324/502

FOREIGN PATENT DOCUMENTS

| DE | 198 02 042 | 7/1999 |
| EP | 0 388 413 | 10/1989 |
| EP | 0 577 988 | 1/1994 |
| WO | WO 96 07562 | 3/1996 |

\* cited by examiner

*Primary Examiner*—Fritz Fleming
(74) *Attorney, Agent, or Firm*—Kenyon & Kenyon

(57) ABSTRACT

The ohmic resistance of a firing element connected in series to a capacitance is measured by charging the capacitance with a measured current for a specifiable charging time, by recording a first firing circuit voltage which drops at the firing circuit at the end of the charging operation and by recording a second firing circuit voltage after the measured current is disconnected and by determining the resistance of the firing element from the two firing circuit voltages and the measured current. An exact measurement of the resistance of the firing element regardless of capacitance fluctuations is made possible in that the charging time for the capacitance of the firing circuit is rated in such a way that the second firing circuit voltage corresponds to a setpoint value.

4 Claims, 2 Drawing Sheets

US 6,362,539 B1

METHOD AND CIRCUIT FOR MONITORING A PRIMER CIRCUIT IN THE SAFETY SYSTEM OF A VEHICLE

BACKGROUND INFORMATION

The present invention relates to a method and a circuit arrangement for monitoring a firing circuit for a safety device in a vehicle, the ohmic resistance of a firing element connected in series to a capacitance being measured by charging the capacitance with a measured current for a specifiable charging time, by recording a first firing circuit voltage which drops at the firing circuit at the end of the charging operation and recording a second firing circuit voltage after the measured current is disconnected and by determining the resistance of the firing element from the two firing circuit voltages and the measured current.

Such a method follows from the still unpublished German Patent Application No. 1 98 02 042. In order to ensure that the firing circuit of a safety device (e.g. airbag, belt tightener) functions perfectly in the event of a collision, the firing circuit should be monitored continuously. A fault in the firing circuit is displayed optically or acoustically in the vehicle. In practice, the following faults can occur, for example, in the firing circuit: a short-circuit can arise between the firing element and the battery voltage or ground. In addition, shunt circuits can occur between the feeds of the firing circuit itself or parallel to the firing circuit capacitor. All of these faults are revealed in that the ohmic resistance of the firing circuit deviates from a known setpoint. For that reason, according to the older German Patent Application No. 1 98 02 042, the ohmic resistance of the firing, element is measured and checked for the presence of a setpoint deviation at periodically repetitive intervals. Since in this connection, the resistance of the firing element is derived from voltages which result from various charge states of the capacitance connected in series to the firing element, the resistance measurement depends very heavily on capacitance fluctuations which, for example, are related to manufacture or arise as the result of varying temperature influences.

The object of the present invention is therefore to specify a method and a circuit arrangement of the type named above with which a precise measurement of the resistance of the firing element is possible regardless of fluctuations of the capacitance present in the firing circuit.

SUMMARY OF THE INVENTION

The named object is achieved, in that the charging time for the capacitance in the firing circuit is rated in such a way that the second firing circuit voltage, which is measured briefly before the measured current is disconnected, corresponds to a setpoint value. If the capacitance is always charged long enough that the second firing voltage measured after the measuring current is disconnected assumes a fixed value, then the ohmic resistance of the firing element can be measured precisely without fluctuations of the firing circuit capacitance having an influence on it.

Accordingly, the charging time for the two firing circuit voltages is determined before the measurement operation by charging the capacitance for a fixed basic charging time after which the measured current is disconnected and the voltage which drops at the firing circuit is then measured. This measured voltage is compared with a setpoint voltage and a correction charging time is determined as a function of the difference between these voltages, a charging time being determined from the correction charging time by addition to the basic charging time, which ensures that the second firing circuit voltage measured in the subsequent measurement operation corresponds to the setpoint value.

This measurement operation can be implemented with a simply configured circuit which requires no expensive current source for the charging of the capacitance in the firing circuit.

DETAILED DESCRIPTION

The circuit arrangement shown in FIG. I includes an alternating current firing circuit ZK for a restraint system (e.g., airbag, belt tightening). This firing circuit ZK is made up of the ohmic resistance Rz of a firing element and a capacitance CZ connected in series to it. A first terminal Z1 of firing circuit ZK is connected to the series connection made up of a diode D, an electronic switch T1, a resistor R1 and an energy reserve C in the form of an electrolytic capacitor. Electrolytic capacitor C together with high-resistance resistor R1 which is connected in series, forms a current source which delivers either the firing current for firing element RZ of firing circuit ZK or a measured current Im for the monitoring of firing circuit ZK. While one of the two electrodes of capacitance C is connected to resistor R1, the other electrode is connected to ground. With the aid of electronic switch T1, preferably a field-effect transistor, it is possible to switch measured current Im through to firing circuit ZK or to disconnect it. Diode D functions as a polarity reversal protection in order to protect transistor T1 from damage by excessive voltage which can arise when firing circuit ZK is fired.

First terminal Z1 of firing circuit ZK is also connected to a control unit SG in which firing circuit voltage UZ which drops at firing circuit ZK is recorded, and as will be described in still greater detail below, is analyzed to determine ohmic resistance RZ of the firing element. Moreover, an electronic switch T3, preferably a field-effect transistor, is connected to first terminal Z1 of firing circuit ZK, it being possible to connect terminal Z1 to ground with switch T3.

Second terminal Z2 is connected to an electronic switch T2 which, similar to the two other switches T1 and T3, is preferably also a field effect transistor, via which second terminal Z2 can be connected to ground.

Figure 1:
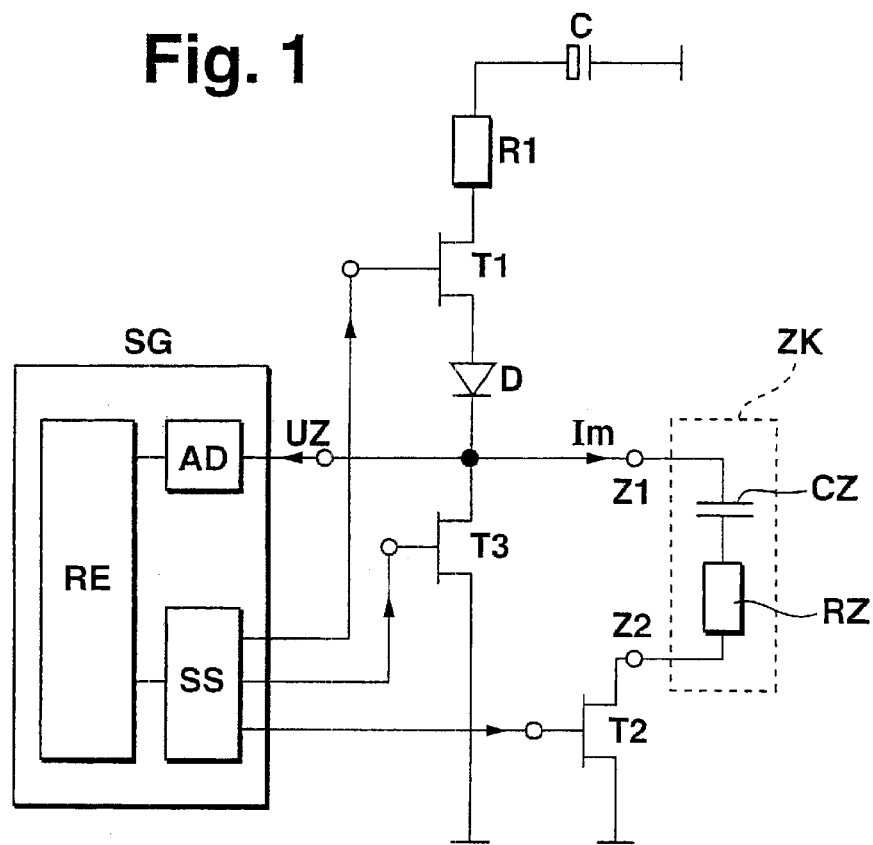
FIG. 1 shows a circuit arrangement for measurement of the firing element resistance.
Figure 2:
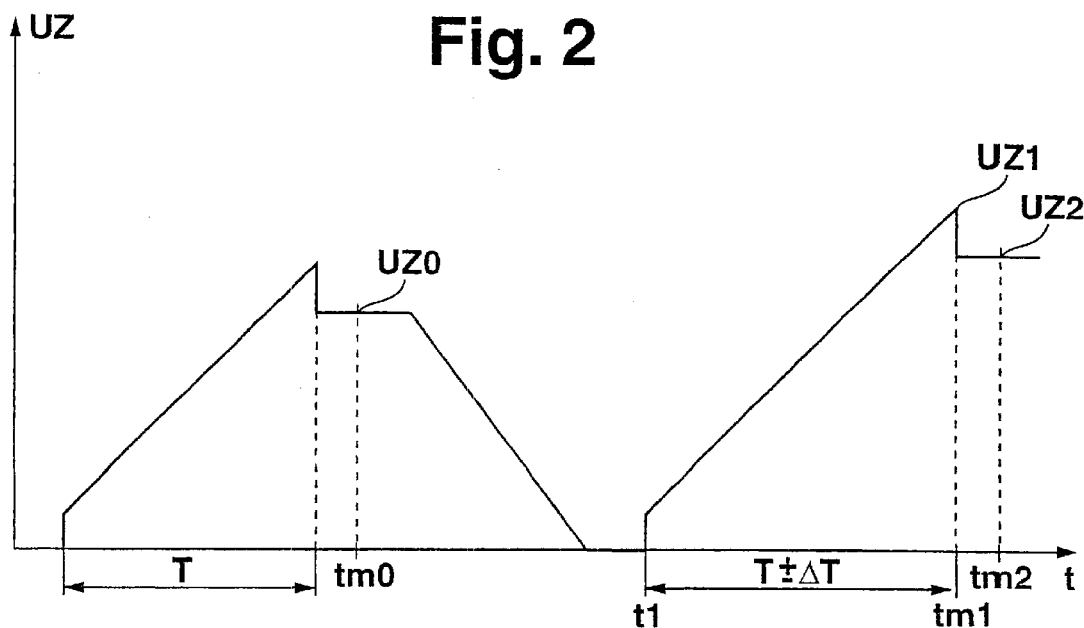
FIG. 2 shows a curve of the firing circuit voltage.
Figure 3:
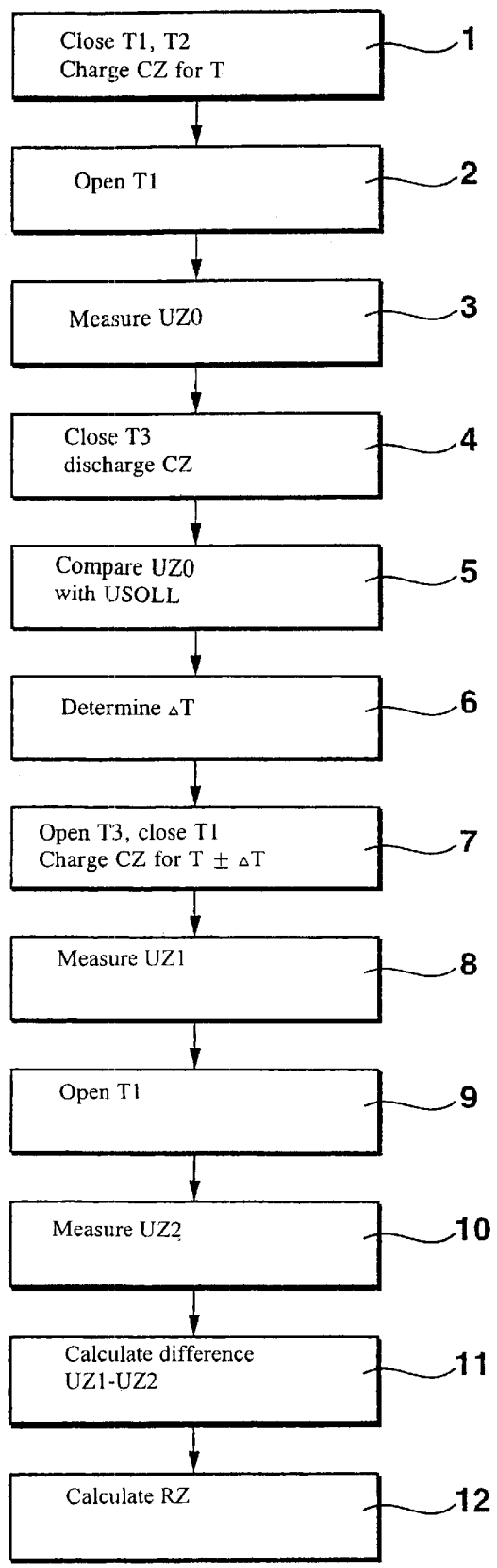
FIG. 3 shows a flow chart of the sequence of operations to determine the firing element resistance.

Control unit SG contains a central data processor RE, an analog-to-digital converter AD which converts firing circuit voltage UZ into a digital signal which can be processed by central data processor RE. In addition, an interface S3 connected to central data processor RE is present from which the control signals from transistors T1 T2, T3 can be supplied to their control electrodes (gates). The procedure implemented by control unit SG to determine resistance RZ of the firing element will now be described on the basis of the curves of firing circuit voltage UZ shown in FIG. 2 and the flow chart shown in FIG. 3.

Assuming that firing circuit capacitor CZ is completely discharged, switches T1 and T2 are closed in an initial operation so that firing circuit capacitor CZ is charged. The charging operation extends over a charging time T which will be identified below as basic charging time. As is evident from FIG. 2, the voltage which drops at firing circuit ZK thus increases. The time curves of firing circuit voltage UZ have been presented in an idealized form in FIG. 2 for reasons of simplicity and have been drawn as a straight line. In reality, however, the charge and discharge voltages of capacitances take the form of an e-function. In selecting basic charging time T, which is stored in central data processor RE as a fixed value, care should be taken that the energy stored in capacitance CZ during this charging process is never sufficient to activate the firing element.

After basic charging time T, switch T1 is opened in a second operation, for which reason firing circuit voltage UZ jumps to a lower value due to the absence of measured current Im. After a specific overswing, time, firing circuit voltage UZ0 present at firing circuit ZK is recorded by the control unit at time tm0 in a third operation 3. Subsequently, switch T3 is closed in a fourth operation 4, as a result of which firing circuit capacitance CZ discharges.

In a fifth operation 5, central data processor RE in control unit SG compares measured firing circuit voltage UZ0 with a setpoint voltage USOLL. As a function of the difference between measured firing circuit voltage UZ0 and setpoint voltage USOLL, a correction charging time $\Delta T$ is determined in the next operation 6. If this correction charging time $\Delta T$ is applied to basic charging time T, the result is a charging time $T \pm \Delta T$ which ensures that the voltage which drops at the firing( circuit after firing circuit capacitance CZ is charged with this corrected charging time $T \pm \Delta T$ exactly corresponds to this setpoint voltage USOLL. If in fact measured firing circuit voltage UZ0 is less than setpoint voltage USOLL, a correction charging time $\Delta T$ is added to basic charging time T and if measured firing circuit voltage UZ0 is greater than setpoint voltage USOLL, then a correction charging time $\Delta T$ is subtracted from basic charging time T.

At time t1, a repeated charging process for firing circuit capacitance CZ is now started in operation 7. For this purpose, switch T1 is closed, switch T2 remains closed and switch T3 is opened. In the eighth operation 8, firing circuit voltage UZ1, which is identified as the first firing circuit voltage, is measured at time tm1 precisely after the end of charging time $T \pm \Delta T$. Immediately after this time tm1, switch T1 is opened in the ninth operation 9 and the measured current is thus disconnected. After a brief transient phase, a second firing circuit voltage UZ2 is measured at time tm2 in the tenth operation 10. Due to charging time $T \pm \Delta T$ which was adapted previously to capacitance CZ present in the firing circuit, this second firing circuit voltage UZ2 will always correspond to setpoint voltage USOLL. Consequently, it is not necessary to use capacitances having extremely close tolerances for the firing circuits, since the method according to the present invention brings about an automatic adaptation to capacitance fluctuations, be they related to manufacture or temperature.

In the eleventh operation 11, the difference between second firing, circuit voltage UZ2 and first firing circuit voltage UZ1 is calculated. In the twelfth operation 12, resistance RZ of the firing element is now calculated as follows:

As expressed in equation (1), voltage jump UZ1–UZ2 can be described by a specific measured current Im1 and the sum of resistance RZ of the firing element and resistance RT2 of switch T2.

$$UZ1-UZ2 = Im1(RZ+RT2) \tag{1}$$

Measured current Im1 can be calculated from the voltages and resistances of the circuit arrangements according to equation (2).

$$Im1 = \frac{UC - UD - UZ2 - Im1(RZ + RT2)}{RZ + RT2 + R1 + RT1} \tag{2}$$

$$Im1 = \frac{UC - UD - UZ2}{2(RZ + RT2) + R1 + RT1}$$

In equation (2) UC is the voltage supplied by energy reserve C, UD is the conducting-state voltage of diode D, RT2 is the resistance of switch T2 and RT1 is the resistance of switch RT1. Except for resistance RZ of the firing element, all variables in equation (2) are known. Accordingly, resistance RZ of the firing element can now be calculated very precisely from equation (1) with the aid of measured current IM1 of equation (2) in central data processor RE of control unit SG, irrespective of capacity fluctuations of the firing circuit.

What is claimed is:

1. A method for monitoring a firing circuit for a safety device in a vehicle, comprising the steps of:

measuring an ohmic resistance of a firing element connected in series to a capacitance by performing a charging operation on the capacitance with a measured current for a specifiable charging time;

recording a first firing circuit voltage that drops at the firing circuit at an end of the charging operation;

recording a second firing circuit voltage after the measured current is disconnected;

determining the ohmic resistance of the firing element from the first firing circuit voltage, the second firing circuit voltage, and the measured current; and rating the specifiable charging time such that the second firing circuit voltage corresponds to a setpoint value.

2. The method according to claim 1, further comprising the step of:

determining the specifiable charging time for the first firing circuit voltage and the second firing circuit voltage before a performance of the measuring step by performing the steps of:

charging the capacitance for a fixed basic charging time, after performing the charging step, disconnecting the measured current and measuring another voltage that drops at the firing circuit, comparing the measured other voltage with a setpoint voltage, determining a correction charging time as a function of a difference between the measured other voltage and the setpoint voltage, and determining the specifiable charging time from the correction charging time by adding the correction charging time to the basic charging time to ensure that the second firing circuit voltage corresponds to the setpoint value.

3. A circuit arrangement for monitoring a firing circuit for a safety device in a vehicle, comprising:

a control unit including:

an arrangement for measuring an ohmic resistance of a firing element connected in series to a capacitance by switching on a measured current for charging the capacitance for a specifiable charging time, an arrangement for measuring a first firing circuit voltage that drops at the firing circuit at an end of the specifiable charging time, an arrangement for disconnecting the measured current,
an arrangement for measuring a second firing circuit voltage,
an arrangement for calculating the ohmic resistance of the firing element from the first measured firing circuit voltage, the second measured firing circuit voltage, and the measured current, and
an arrangement for rating the specifiable charging time such that the second firing circuit voltage corresponds to a setpoint value.

4. The circuit arrangement according to claim 3, wherein the control unit further includes:

an arrangement for determining the specifiable charging time for the first firing circuit voltage and the second firing circuit voltage before an activation of the arrangement for measuring, the arrangement for determining the specifiable charging time including:
an arrangement for switching on the measured current,
an arrangement for charging the capacitance for a fixed basic charging time,
an arrangement for disconnecting the measured current,
an arrangement for measuring another voltage that drops at the firing circuit,
an arrangement for comparing the measured other voltage with a setpoint voltage,
an arrangement for determining a correction charging time as a function of a difference between the measured other voltage and the setpoint voltage, and
an arrangement for determining the specifiable charging time by adding the correction charging time to the basic charging time, the specifiable charging time ensuring that the second firing circuit voltage corresponds to the setpoint value.

* * * * *